(12) United States Patent
Zeng et al.

(10) Patent No.: US 6,921,957 B2
(45) Date of Patent: Jul. 26, 2005

(54) LOW FORWARD VOLTAGE DROP SCHOTTKY BARRIER DIODE AND MANUFACTURING METHOD THEREFOR

(75) Inventors: Jun Zeng, Torrance, CA (US);
Ming-Jiang Zhou, Torrance, CA (US);
Tzong-Shiann Wu, Torrance, CA (US)

(73) Assignees: Pyramis Corporation, Torrance, CA (US); Delta Electronics, Inc. (TW)

( * ) Notice: Subject to any disclaimer, the term of this patent is extended or adjusted under 35 U.S.C. 154(b) by 0 days.

(21) Appl. No.: 10/335,022

(22) Filed: Dec. 31, 2002

(65) Prior Publication Data

US 2003/0155628 A1 Aug. 21, 2003

(30) Foreign Application Priority Data

Feb. 21, 2002 (TW) .......................................... 91103067 A (51) Int. Cl.⁷ .............................................. H01L 29/72

(52) U.S. Cl. ........................ 257/476; 257/471; 257/472; 257/475; 438/576; 438/581

(58) Field of Search ................................. 257/476, 471, 257/472, 475, 139, 77, 144; 438/576, 581

(56) References Cited

U.S. PATENT DOCUMENTS 5,679,966 A * 10/1997 Baliga et al. ............... 257/139
6,426,541 B2 * 7/2002 Chang et al. ............... 257/472

* cited by examiner

*Primary Examiner*—Edward Wojciechowicz
(74) *Attorney, Agent, or Firm*—Michael F. Krieger; Kirton & McConkie (57) ABSTRACT

A new low forward voltage drop Schottky barrier diode and its manufacturing method are provided. The method includes steps of providing a substrate, forming plural trenches on the substrate, and forming a metal layer on the substrate having plural trenches thereon to form a barrier metal layer between the substrate and the surface metal layer for forming the Schottky barrier diode.

13 Claims, 12 Drawing Sheets

6.0um
Breakdown voltage: 28 volts

Fig. 8

1.0um
Breakdown voltage: 36 volts

LOW FORWARD VOLTAGE DROP SCHOTTKY BARRIER DIODE AND MANUFACTURING METHOD THEREFOR

RELATED APPLICATIONS

This application claims priority to Taiwan Application Serial No. 091103067, filed Feb. 21, 2002.

BACKGROUND

1. Field of the Invention

This invention relates to a Schottky barrier diode and a manufacturing method therefor, and more particular to a low forward voltage drop Schottky barrier diode and a manufacturing method therefor.

2. Background of the Invention

Figure 1:
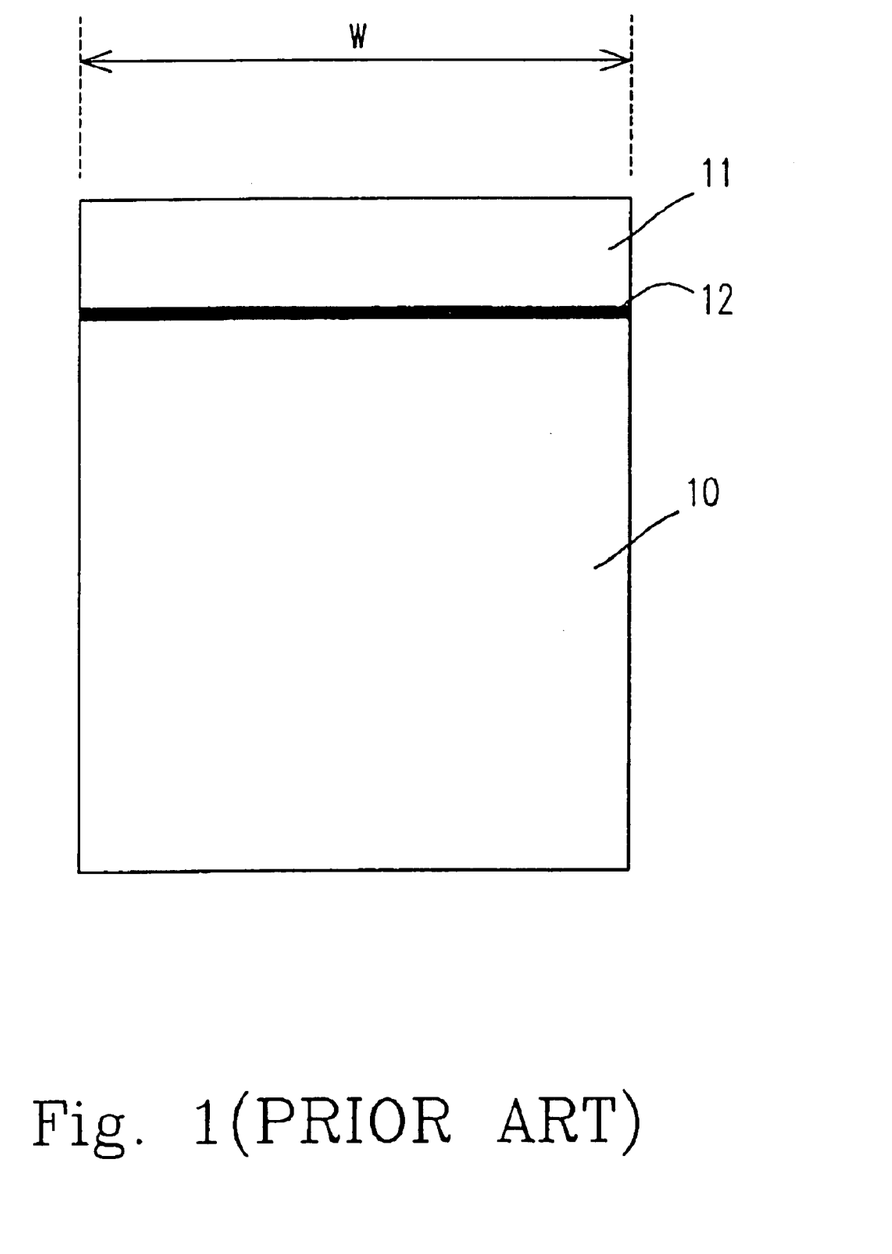
FIG. 1 shows a schematic structure view of a conventional SBD.
Figure 2:
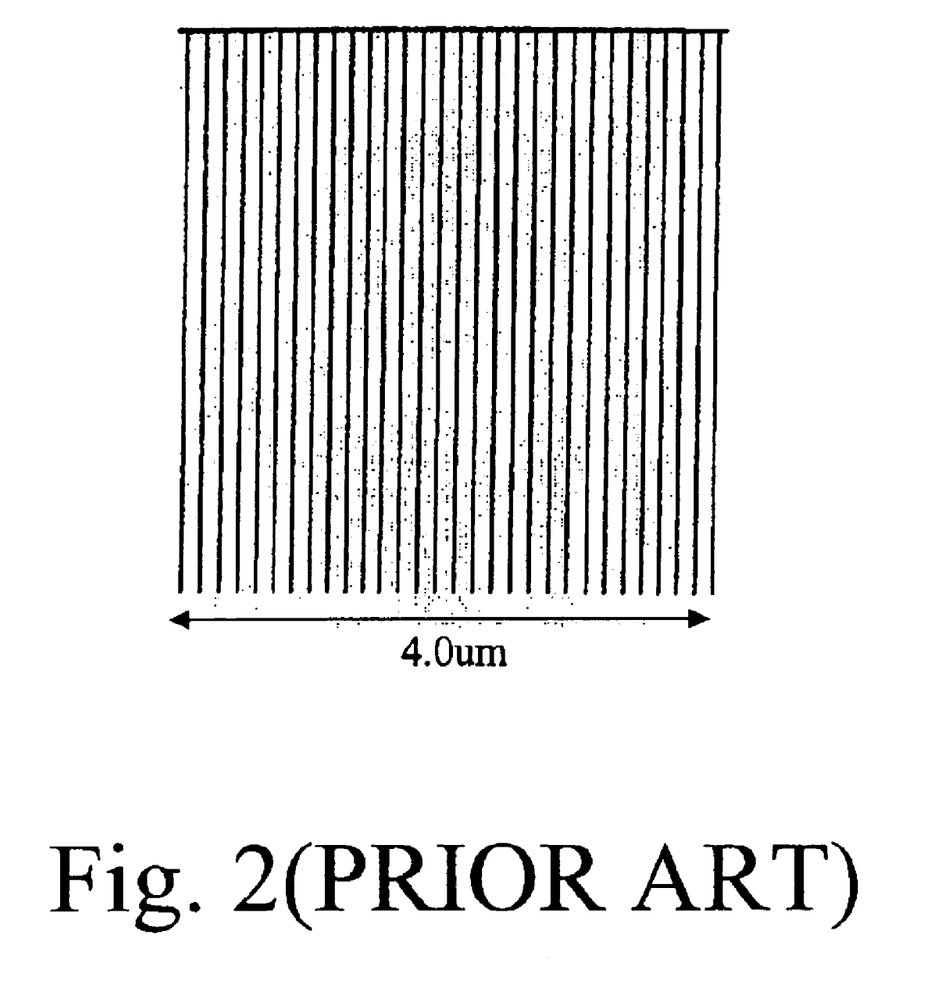
FIG. 2 shows the forward conduction current distribution of the conventional SBD.

Recently, Schottky barrier diodes have been extensively used in a DC—DC converter, a VRM (voltage regulator module), a telecom/server, an adaptor, and a charger. Please refer to FIG. 1 which shows a schematic structure view of a conventional Schottky barrier diode. As shown in FIG. 1, the manufacturing method of the Schottky barrier diode (SBD) includes forming a barrier metal layer 12 followed by depositing a metal layer 11 on a silicon chip 10. The simulation result of a current distribution in the forward conduction mode in the conventional SBD is shown in FIG. 2.

Among all the applications, the SBD is required to provide a low forward voltage drop, low power consumption, and a low leakage current. In order to meet these demands, the forward voltage drop of the SBD must be reduced under a specific operation current range. At the same time, the reverse leakage current thereof can not be increased when a reverse bias is applied. At the present, there are two important methods which are widely used for reducing the forward voltage drop. One is to increase the size of the chip, so as to increase the surface area of the SBD. As the result, the forward voltage drop of the SBD can be reduced for a given current. However, this method also increases the cost of the chip. The other method is to use a barrier metal with a low barrier height, but it will increase the leakage current of the device. It also reduces the reverse blocking voltage of the device and degrades the performance of the device at high temperature. Moreover, the development of a new barrier metallization process is a time consuming procedure due to the sophisticated chemistry and metallurgy at the metal and silicon interface. Furthermore, from the manufacturer's viewpoint, it would be a risk to change the barrier metal because some negative effect might be introduced to the manufacturing control and the product yield, as well as contamination control in the fabrication.

Figure 3:
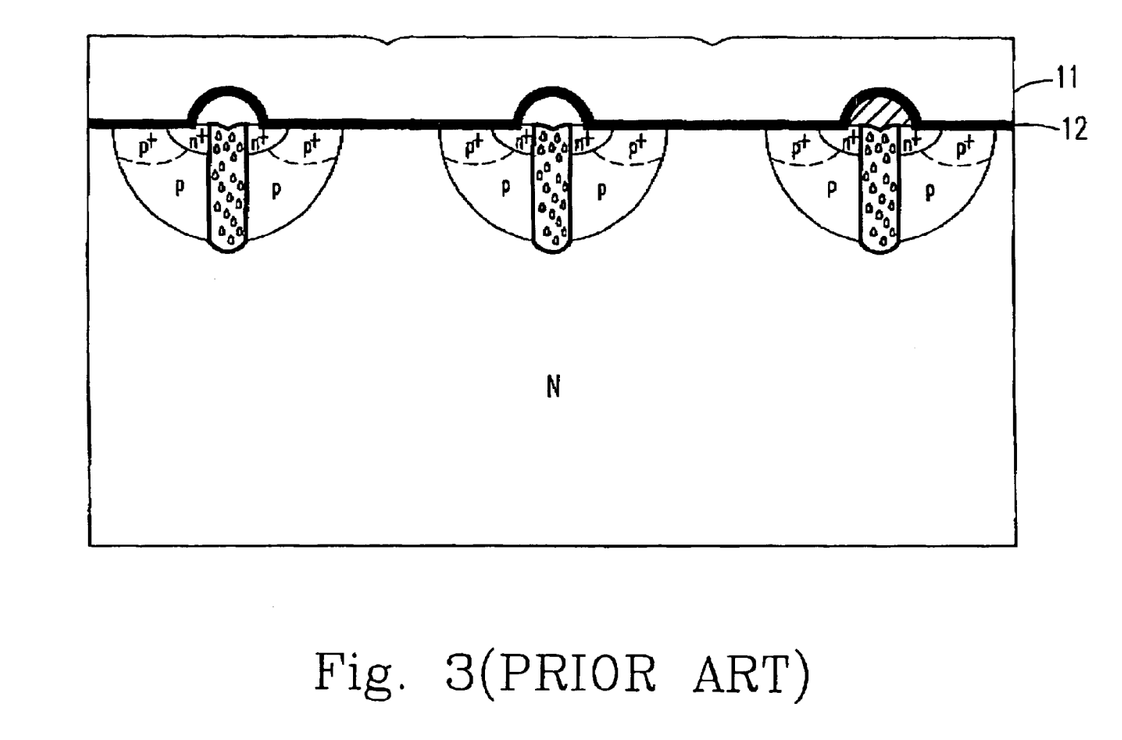
FIG. 3 shows a first schematic structure view of the conventional integration of the SBD and the MOSFET.

In addition, in some applications, such as the non-insulated synchronization converter and the insulated DC/DC converter, the SBD therein are often integrated with the MOSEFT to improve the efficiency of the electronic system. Please refer to FIGS. 3–5 which are respectively schematic views of the conventional monolithically integrations of the SBD and the MOSEFT. However, these conventional schemes only provide a limited forward voltage drop reduction due to the limitation of silicon surface area.

Because of the technical limitations and poor electrical performances described above, the applicant keeps on carving unflaggingly to develop "low forward voltage drop Schottky barrier diode and manufacturing method therefor" through wholehearted experience and research.

SUMMARY OF THE INVENTION

It is an object of the present invention to provide a Schottky barrier diode which can provide a low forward voltage drop and manufacturing method therefor.

It is another object of the present invention to provide a low forward voltage drop Schottky barrier diode which can achieve a super low forward voltage without changing the metal and the metallization mechanism and also can achieve a better trade-off between the forward voltage drop and the breakdown voltage through an optimized association of the size of the puckered structure and the depth of the unit trench.

It is a further object of the present invention to provide a SBD structure which has a more efficient forward current conduction than conventional ones.

It is an additional object of the present invention to provide an integrated structure of a SBD and a MOSFET having the characteristics of low impedance, low forward voltage drop, and an improved body-diode reverse recovery for improving the efficiency of the total electric equipment.

In accordance with an aspect of the present invention, a method for manufacturing a Schottky barrier diode includes steps of providing a substrate, forming plural trenches on the substrate, and forming a metal layer on the substrate having plural trenches thereon to form a barrier metal layer between the substrate and the top surface metal layer for forming the Schottky barrier diode.

Preferably, the Schottky barrier diode is a low voltage Schottky barrier diode.

Preferably, the substrate is made of one of silicon and silicon carbide material.

Preferably, the Schottky barrier diode is applied to an electrical circuit.

Certainly, the electrical circuit can be one selected from a group consisting of a DC—DC converter, a VRM (Voltage Regulator Module), a telecom/server, an adaptor, and a charger.

In accordance with another aspect of the present invention, a Schottky barrier diode structure includes a substrate with plural trenches, a metal layer formed on the substrate with plural trenches thereon, and a barrier metal layer formed between the substrate and the top surface metal layer to increase a surface contact area of the Schottky barrier diode through plural trenches.

Preferably, the Schottky barrier diode is a low voltage Schottky barrier diode.

Preferably, the substrate is made of one of silicon and silicon carbide material.

Preferably, the Schottky barrier diode is applied in an electrical circuit.

Certainly, the electrical circuit can be one selected from a group consisting of a DC—DC converter, a VRM (Voltage Regulator Module), a telecom/server, an adaptor, and a charger.

In accordance with further another aspect of the present invention, an integrated structure for being applied in a power semiconductor device includes a MOSFET (Metal Oxide Semiconductor Field Effect Transistor) and a Schottky barrier diode. The Schottky barrier diode includes a substrate having plural trenches, a metal layer formed on the substrate having plural trenches thereon, and a barrier metal layer formed between the substrate and the metal layer to increase a surface contact area of the Schottky barrier diode through plural trenches.

Preferably, the Schottky barrier diode is a low voltage Schottky barrier diode.

Preferably, the substrate is made of one of silicon and silicon carbide material.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The present invention is related to the structure of the SBD (Schottky Barrier Diode) and the manufacturing method therefor to achieve a super low forward voltage without changing the metal and the metallization mechanism of SBD.

Figure 6:
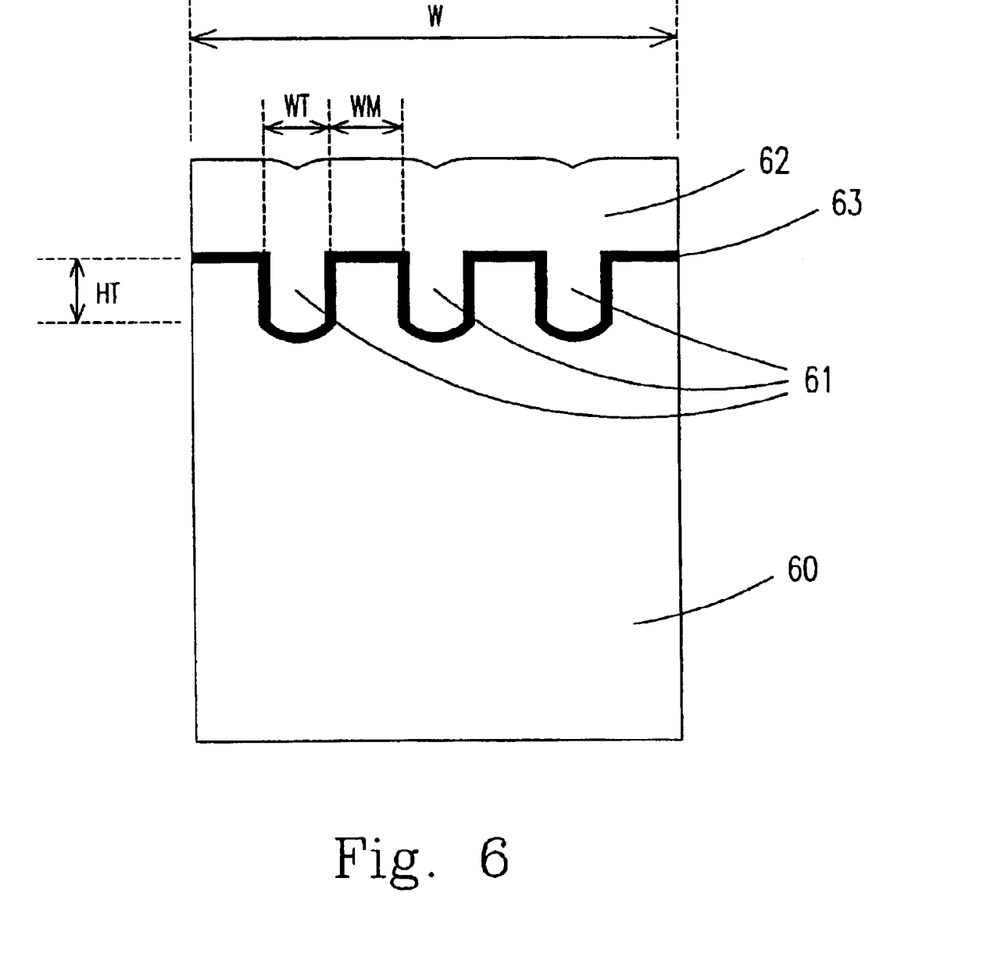
FIG. 6 shows a schematic structure view of the SBD in a preferred embodiment according to the present invention.

Please refer to FIG. 6 illustrating a SBD schematic structure view of a preferred embodiment according to the present invention. As shown in FIG. 6, it shows the manufacturing method of the SBD. Firstly, a silicon chip 60 is etched to form plural trenches 61, wherein the silicon chip 60 could be to be silicon or silicon carbon, so that the surface of the silicon chip 60 will become a "puckered surface".

Then, the barrier metal layer 63 of the SBD will be formed on the puckered surface of the silicon chip 60, followed by depositing a top metal layer 62. Thus the whole contact surface area of the SBD is enlarged, but the horizontal dimension of the element doesn't have to increase at the same time. For instance, supposing the surface contact area of the conventional SBD in FIG. 1 is W*Z, thus that of the present invention will become (W+n*HT*2)*Z, wherein Z is the width of the element, HT is the depth of the trenches, and n is a number of the puckered structures of the repeated plural units in a limited horizontal length W. As shown in FIG. 6, n equals to an integral portion of W/(WT+WM), wherein WT is the width of the trench, and WM is the distance of each two trenches. Therefore, the surface contact area of the SBD will be increased through utilizing a smaller unit puckered structure (WT+WM) and a deeper trench HT. Consequently, a super low forward voltage drop SBD can be obtained in this way.

Figure 7:
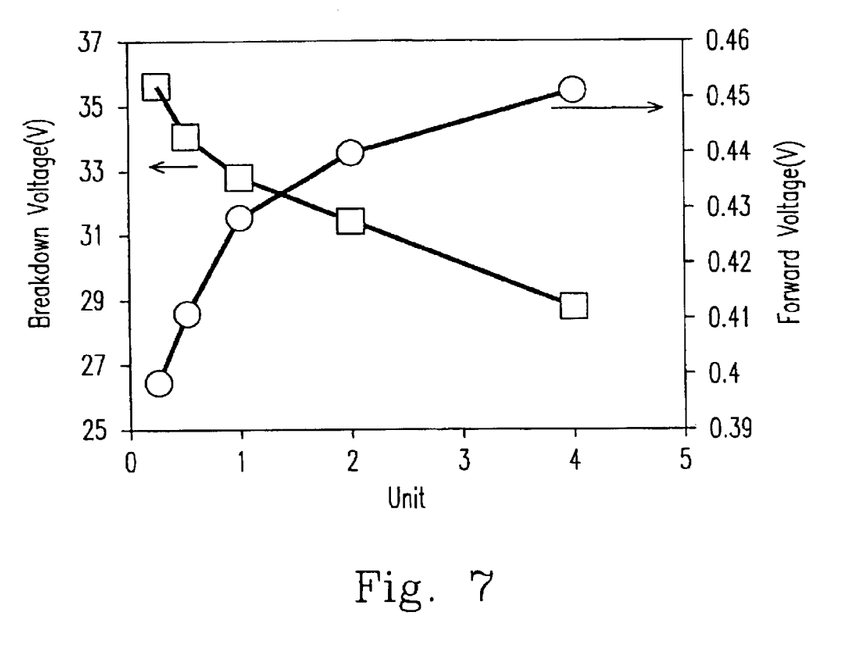
FIG. 7 shows a plot of the forward voltage drop and the reverse breakdown voltage vs. the spacing between two unit cells in a preferred embodiment according to the present invention.
Figure 8:
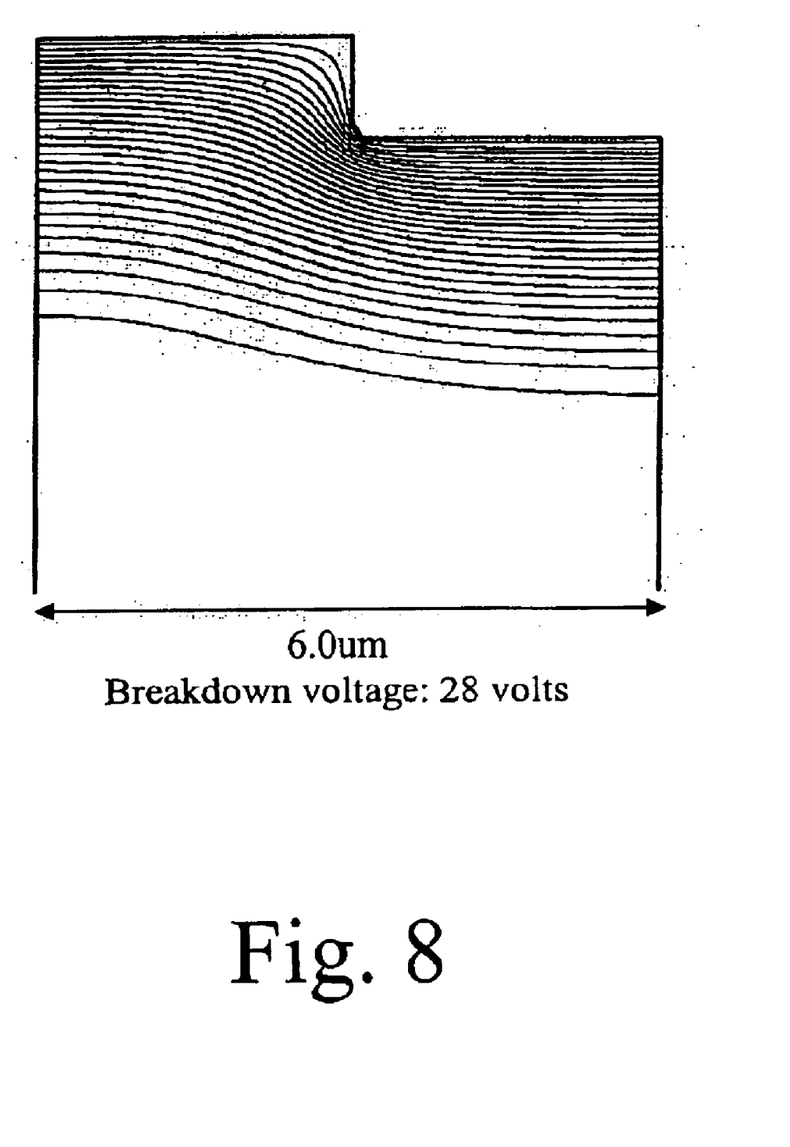
FIG. 8 shows a first schematic simulation view of the electrostatic potential lines of the SBD in a preferred embodiment according to the present invention.
Figure 9:
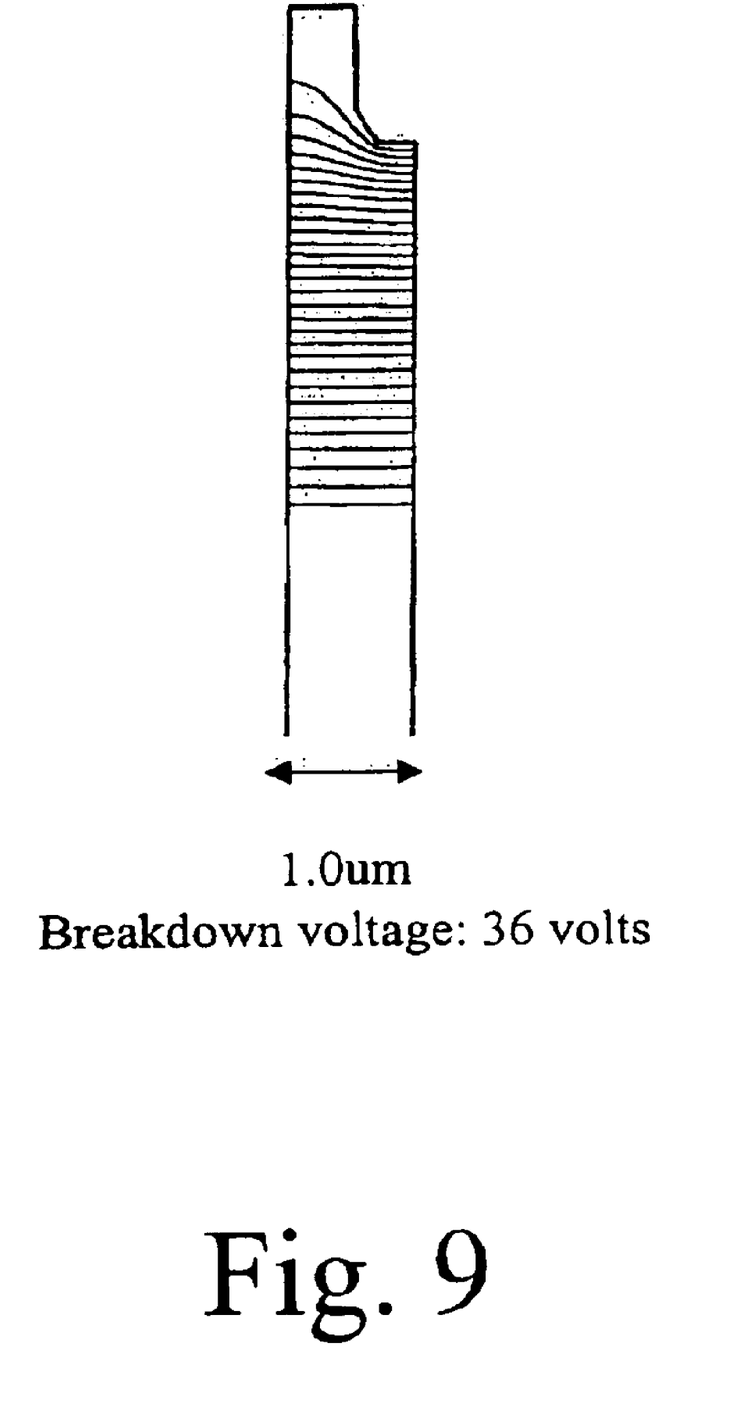
FIG. 9 shows a second schematic simulation view of the electrostatic potential lines of the SBD in a preferred embodiment according to the present invention.

The result described above can be simulated and verified by computer simulations. For example, FIG. 7 shows a plot of the forward voltage drop and the reverse breakdown voltage for a trench 61 with a 0.5 $\mu$m depth. When a unit puckered structure is changed from 4 $\mu$m to 0.25 $\mu$m, the difference of the forward voltage drop can be obtained to be 50 mV Furthermore, the smaller the unit structure trench contained in the element, the higher the breakdown voltage of the element. That is because, in the element structure of the new SBD, the electric field is mostly intensive at the bottom corners of the trench. Compared with the prior arts, this phenomenon causes the reduction of the breakdown voltage of the element. However, the smaller the used unit puckered, the shorter the distance between each two trenches. Therefore, the electrical shielding effect between each two adjacent trenches becomes more significant. It results in less electric field concentrated at the bottom of the trench and thereby improves the breakdown voltage of the element. For proving this, a new SBD with respectively 6.0 $\mu$m and 1.0 $\mu$m puckered structures each of which has a trench depth of 1.5 $\mu$m are simulated to study their breakdown characteristics. In the SBD with 6.0 $\mu$m puckered structure, the breakdown voltage of the element is about 28 V, where the equal potential line of the electrostatic energy is shown in FIG. 8. In the SBD with 1.0 $\mu$m puckered structure, the breakdown voltage of the element is about 36 V, where the equal potential line of the electrostatic energy is shown in FIG. 9. FIGS. 8 & 9 obviously show that, in the SBD with the trench puckered structure, because of the shielding effect between two adjacent trenches, the smaller unit puckered structures will have less electric field concentration at the trench bottom corners than the larger one. The best distribution of the forward voltage drop and the breakdown voltage can be achieved through the best association of the size of the unit puckered structure and the depth of the trench.

Figure 10:
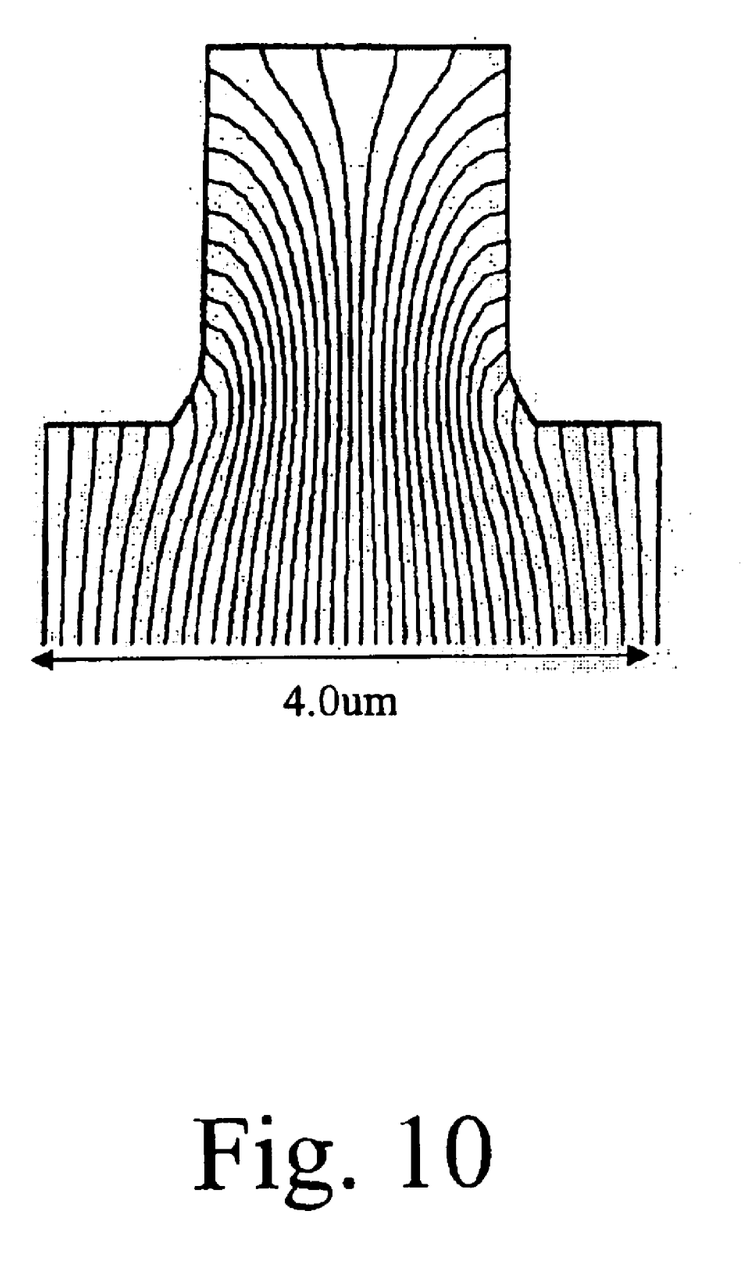
FIG. 10 shows a schematic view of the simulated forward current profiles of the SBD in a preferred embodiment according to the present invention.

In addition, the current distribution in the SBD according to the present invention is obviously different from that in the prior art. FIGS. 2 and 10 are respectively the simulation results showing the current distribution of the conventional and the new SBD. Compared these two figures, the SBD according to the present invention provides a more efficient current distribution than the conventional one.

In some applications, such as non-insulated synchronization converter and insulated DC/DC converter, the SBD therein are often integrated with the MOSEFT to improve the performance of the electric equipment. Now, it can be replaced by using the new SBD disclosed in this invention to integrate with the MOSFET. As the results, the new integrated device achieves more efficient silicon utilization and provides low impedance, low forward voltage drop, and an improved reverse recovery characteristic.

Figure 4:
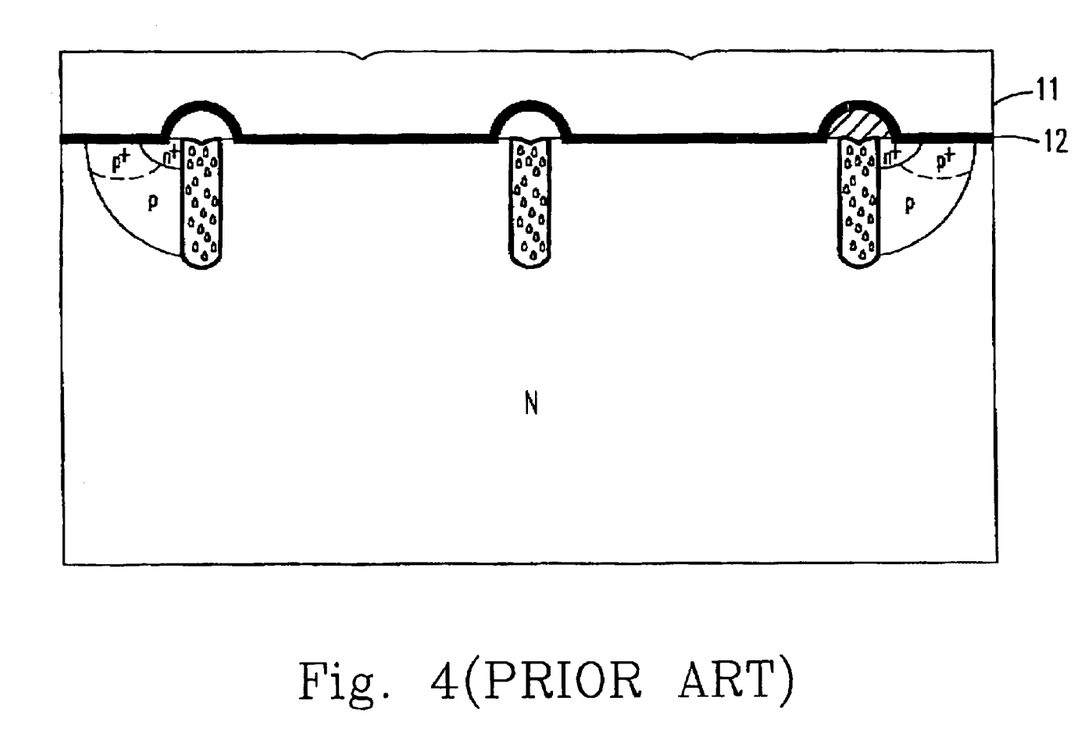
FIG. 4 shows a second schematic structure view of the conventional integration of the SBD and the MOSFET.
Figure 5:
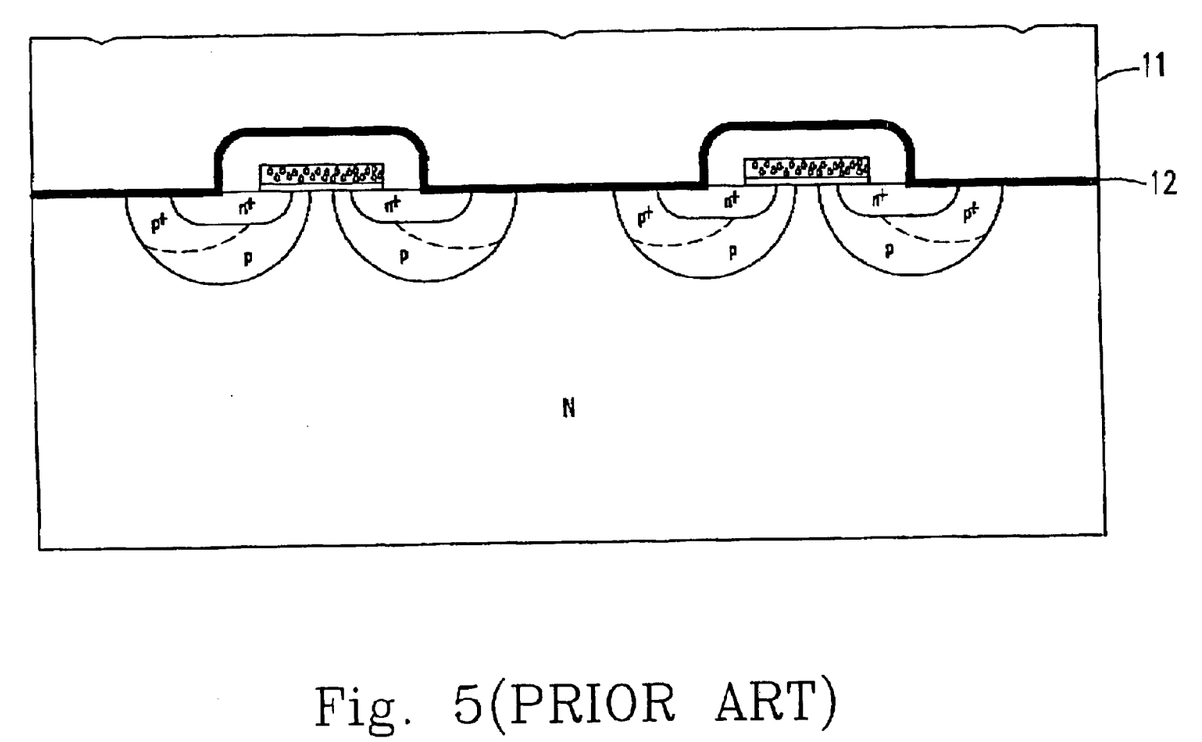
FIG. 5 shows a third schematic structure view of the conventional integration of the SBD and the MOSFET.
Figure 11:
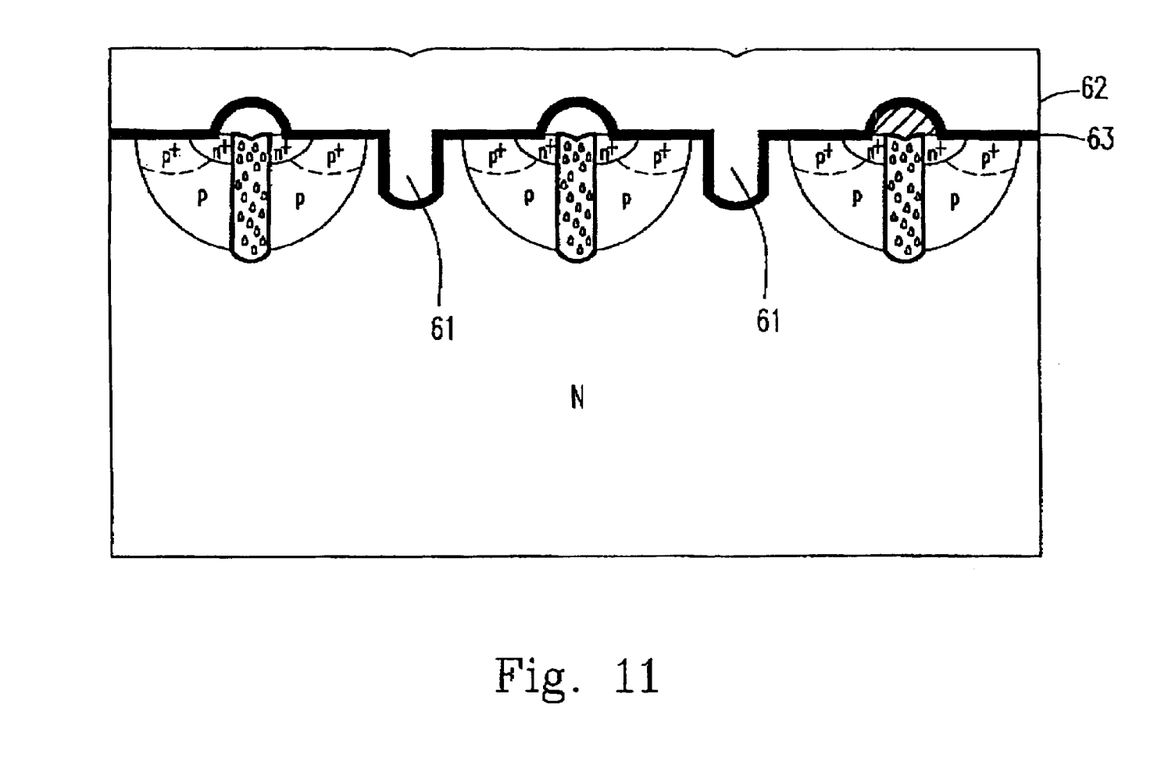
FIG. 11 shows a schematic structure view of the integration of the SBD and the MOSFET in a preferred embodiment according to the present invention.
Figure 12:
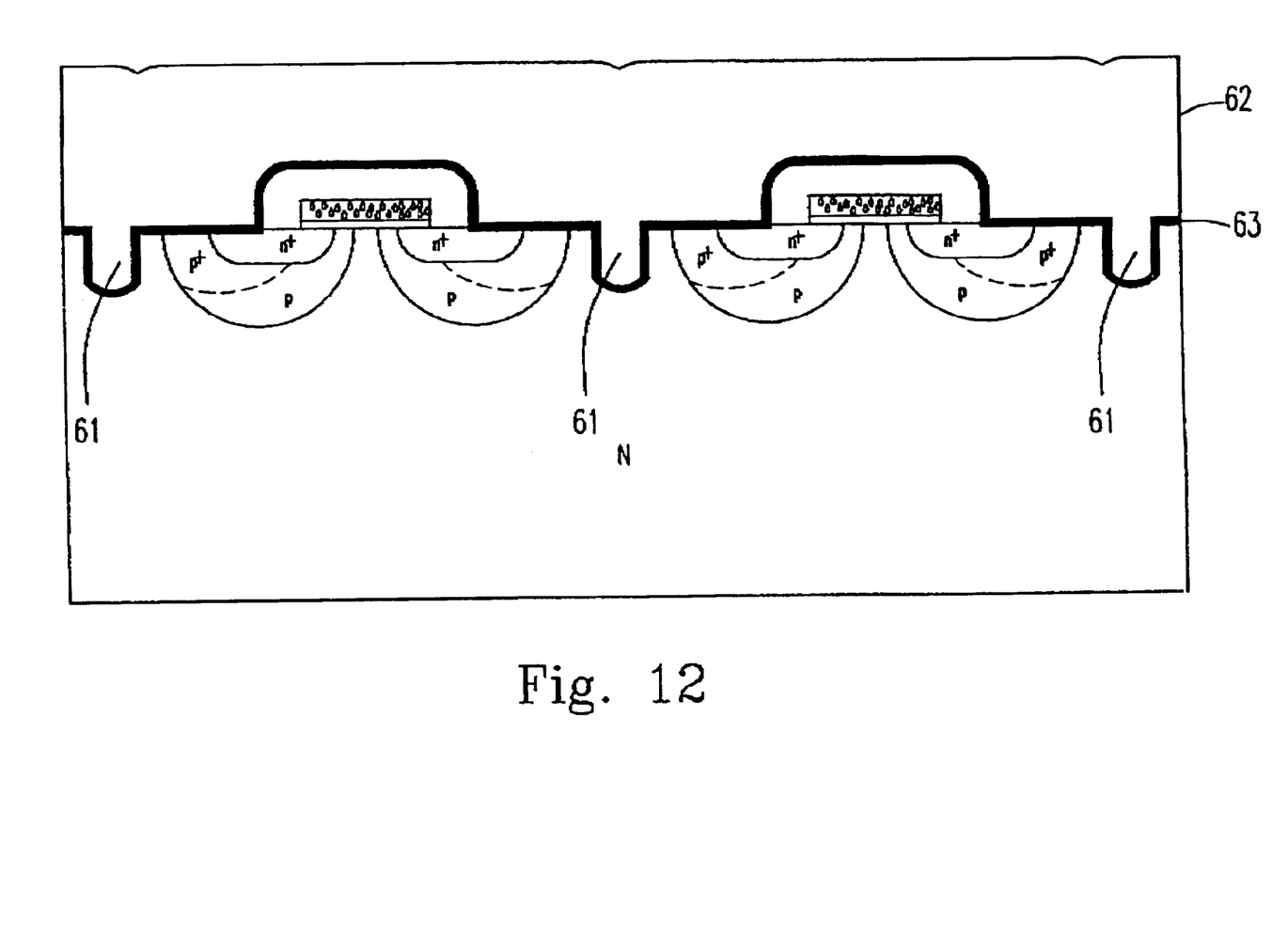
FIG. 12 shows a schematic structure view of the integration of the SBD and the MOSFET in another preferred embodiment according to the present invention.

Please refer to FIG. 11. FIG. 11 shows the schematic cross sectional view of the integration of SBD and MOSFET with the trench-gated structure. As shown in FIG. 11, the SBD replaces the conventional SBD in the integration structure in FIGS. 3 and 4. Furthermore, comparing with the integration structure in FIG. 4, FIG. 12 shows the replacement of the conventional SBD by the SBD in the present invention. According to this, the integration structure can produce a silicon application with low impedance and a low forward voltage drop as well as an improved body-diode of the power MOSFET, for improving the efficiency of the electric equipment.

Also, the electric field concentration at the bottom of the trench in the SBD of the integrated element will be further reduced. That is because the P/N junctions provide an additional shielding effect.

In view of the aforesaid, the super low forward voltage drop SBD and the manufacturing method therefor disclosed in the present invention provides a low forward voltage drop SBD which can achieve a super low forward voltage without changing the metallization mechanism and also can achieve a better trade-off between the forward voltage drop and the breakdown voltage through a best association of the size of the puckered structure and the depth of the trench. Moreover, the present invention also provides a SBD structure which has a more efficient current distribution than conventional ones.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a Schottky barrier diode, comprising steps of:
   providing a substrate;
   forming plural trenches in said substrate, wherein said substrate is free from a dopant region directly below said trenches;
   forming a barrier metal layer on said substrate having said plural trenches thereon; and
   forming a metal layer on said barrier metal layer for forming said Schottky barrier diode.

2. A method according to claim 1 wherein said Schottky barrier diode is a forward voltage drop Schottky barrier diode.

3. A method according to claim 1 wherein said substrate is made of one of silicon and silicon carbide material.

4. A method according to claim 1 wherein said Schottky barrier diode is used in an electrical circuit.

5. A method according to claim 4 wherein said electrical circuit is one selected from a group consisting of a DC—DC converter, a VRM (Voltage Regulator Module), a telecom/server, an adaptor, and a charger.

6. A Schottky barrier diode structure, comprising:
   a substrate having plural trenches, wherein said substrate is free from a dopant region directly below said trenches;
   a metal layer formed on said substrate having said plural trenches thereon; and
   a barrier metal layer formed between said substrate and said metal layer, thereby increasing a surface contact area of said Schottky barrier diode through said plural trenches.

7. A structure according to claim 6 wherein said Schottky barrier diode is a forward voltage drop Schottky barrier diode.

8. A structure according to claim 6 wherein said substrate is made of one of silicon and silicon carbide material.

9. A structure according to claim 6 wherein said Schottky barrier diode is used in an electrical circuit.

10. A structure according to claim 9 wherein said electrical circuit is one selected from a group consisting of a DC—DC converter, a VRM (Voltage Regulator Module), a telecom/server, an adaptor, and a charger.

11. An integrated structure for being applied in a power semiconductor device, comprising:
    a MOSFET (Metal Oxide Semiconductor Field Effect Transistor); and
    a Schottky barrier diode comprising:
      a substrate having plural trenches, wherein said substrate is free from a dopant region directly below said trenches;
      a metal layer formed on said substrate having said plural trenches thereon; and
      a barrier metal layer formed between said substrate and said metal layer, thereby increasing a surface contact area of said Schottky barrier diode through said plural trenches.

12. A structure according to claim 11 wherein said Schottky barrier diode is a forward voltage drop Schottky barrier diode.

13. A structure according to claim 11 wherein said substrate is made of one of silicon and silicon carbide material.

* * * * *